(12) United States Patent
Takeda et al.

(10) Patent No.: US 9,559,022 B1
(45) Date of Patent: Jan. 31, 2017

(54) METHOD OF MANUFACTURING SEMICONDUCTOR DEVICE

(71) Applicant: HITACHI KOKUSAI ELECTRIC INC., Tokyo (JP)

(72) Inventors: Tsuyoshi Takeda, Toyama (JP); Toshiyuki Kikuchi, Toyama (JP)

(73) Assignee: HITACHI KOKUSAI ELECTRIC INC., Tokyo (JP)

( * ) Notice: Subject to any disclaimer, the term of this patent is extended or adjusted under 35 U.S.C. 154(b) by 0 days.

(21) Appl. No.: 15/195,086

(22) Filed: Jun. 28, 2016

(30) Foreign Application Priority Data

Mar. 30, 2016 (JP) .................................. 2016-068138

(51) Int. Cl.
*H01L 21/02* (2006.01)
*H01L 21/66* (2006.01)

(52) U.S. Cl.
CPC .......... *H01L 22/20* (2013.01); *H01L 21/0217* (2013.01); *H01L 21/0234* (2013.01); *H01L 21/02211* (2013.01); *H01L 21/02274* (2013.01); *H01L 22/10* (2013.01)

(58) Field of Classification Search
CPC ... H01L 21/02518; H01L 21/70; H01L 21/702
See application file for complete search history.

(56) References Cited

U.S. PATENT DOCUMENTS

2015/0093913 A1 4/2015 Toyoda et al.
2015/0162233 A1 6/2015 Nagai et al.

FOREIGN PATENT DOCUMENTS

JP         4112821 B2    7/2008
JP         2015-092533 A  5/2015
JP         2015-111074 A  6/2015

*Primary Examiner* — Cheung Lee
(74) *Attorney, Agent, or Firm* — Volpe and Koenig, P.C.

(57) ABSTRACT

A method of manufacturing a semiconductor device, includes: forming a film, wherein the act of forming a film includes: transferring a substrate to a process chamber; supplying a first gas to the substrate; and supplying a second gas to the substrate by converting the second gas to plasma with a first high-frequency wave; and performing an adjustment after the act of forming the film, wherein the act of performing includes: measuring a charging condition of the substrate, setting a second high-frequency wave based on the measured charging condition, supplying a third gas to the substrate by converting the third gas to plasma with the second high-frequency wave, and adjusting the charging condition of the substrate.

10 Claims, 8 Drawing Sheets

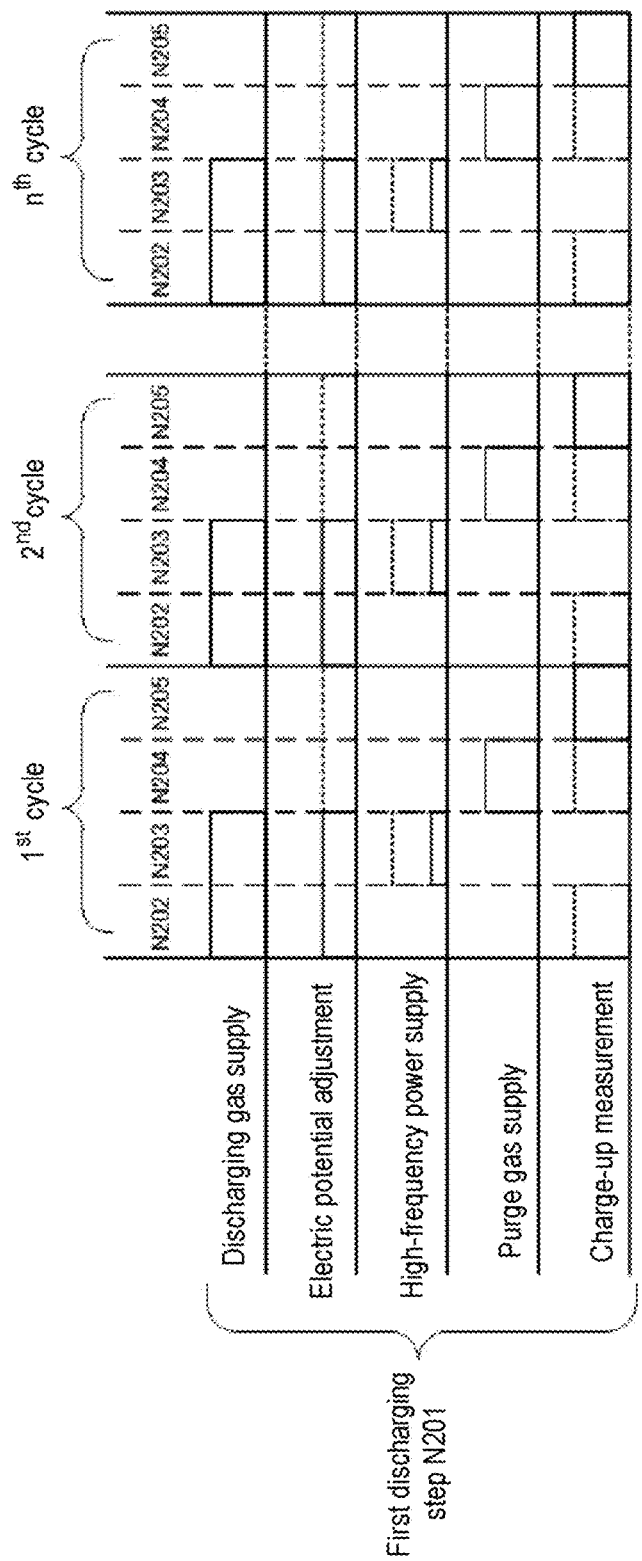

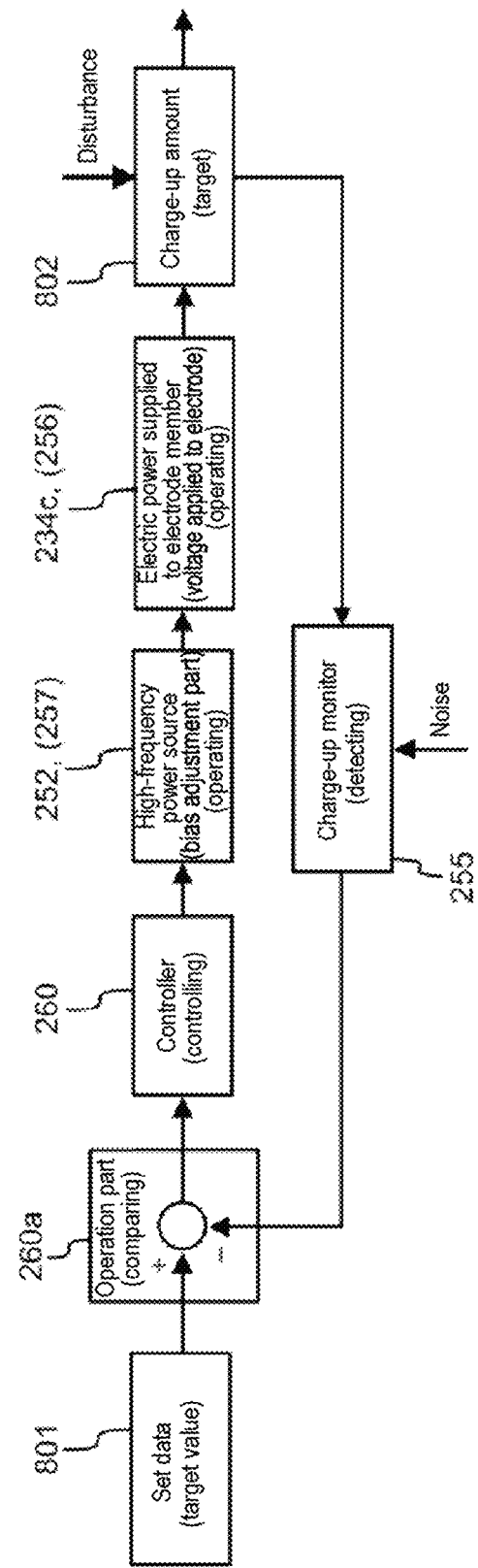

METHOD OF MANUFACTURING SEMICONDUCTOR DEVICE

CROSS-REFERENCE TO RELATED APPLICATION

This application is based upon and claims the benefit of priority from Japanese Patent Application No. 2016-68138, filed on Mar. 30, 2016, the entire contents of which are incorporated herein by reference.

TECHNICAL FIELD

The present disclosure relates to a method of manufacturing a semiconductor device.

BACKGROUND

Along with the high integration of a semiconductor device represented by a large scale integrated circuit (hereinafter referred to as an LSI), a dynamic random access memory (DRAM), a flash memory or the like, miniaturization of a circuit pattern is underway. In a manufacturing process of a semiconductor device, plasma processing is performed as processing for the realization of miniaturization.

Along with the miniaturization, it is required that processing be uniformly performed within a substrate plane. However, depending on the charging condition of the substrate, there may be a case where an activated gas is not uniformly supplied within the substrate plane. In this case, it is difficult to form a uniform film within the substrate plane.

SUMMARY

The present disclosure provides some embodiments of a technique of forming a uniform film within a substrate plane.

According to one embodiment of the present disclosure, there is provided a technique, including: forming a film, wherein the act of forming the film includes transferring a substrate to a process chamber, supplying a first gas to the substrate, and supplying a second gas to the substrate by converting the second gas to plasma with a first high-frequency wave; and performing an adjustment after the act of forming the film, wherein the act of performing the adjustment includes: measuring a charging condition of the substrate, setting a second high-frequency wave based on the measured charging condition, supplying a third gas to the substrate by converting the third gas to plasma with the second high-frequency wave, and adjusting the charging condition of the substrate.

BRIEF DESCRIPTION OF THE DRAWINGS

FIG. 7 illustrates a sequence example of a discharging process according to one embodiment of the present disclosure.

FIG. 8 is a block diagram of discharging feedback control according to one embodiment of the present disclosure.

DETAILED DESCRIPTION

An embodiment of the present disclosure will now be described.

One Embodiment

Hereinafter, one embodiment of the present disclosure will be described with reference to the drawings.

(1) Configuration of Substrate Processing Apparatus

First, descriptions will be made on a substrate processing apparatus according to one embodiment of the present disclosure.

Figure 1:
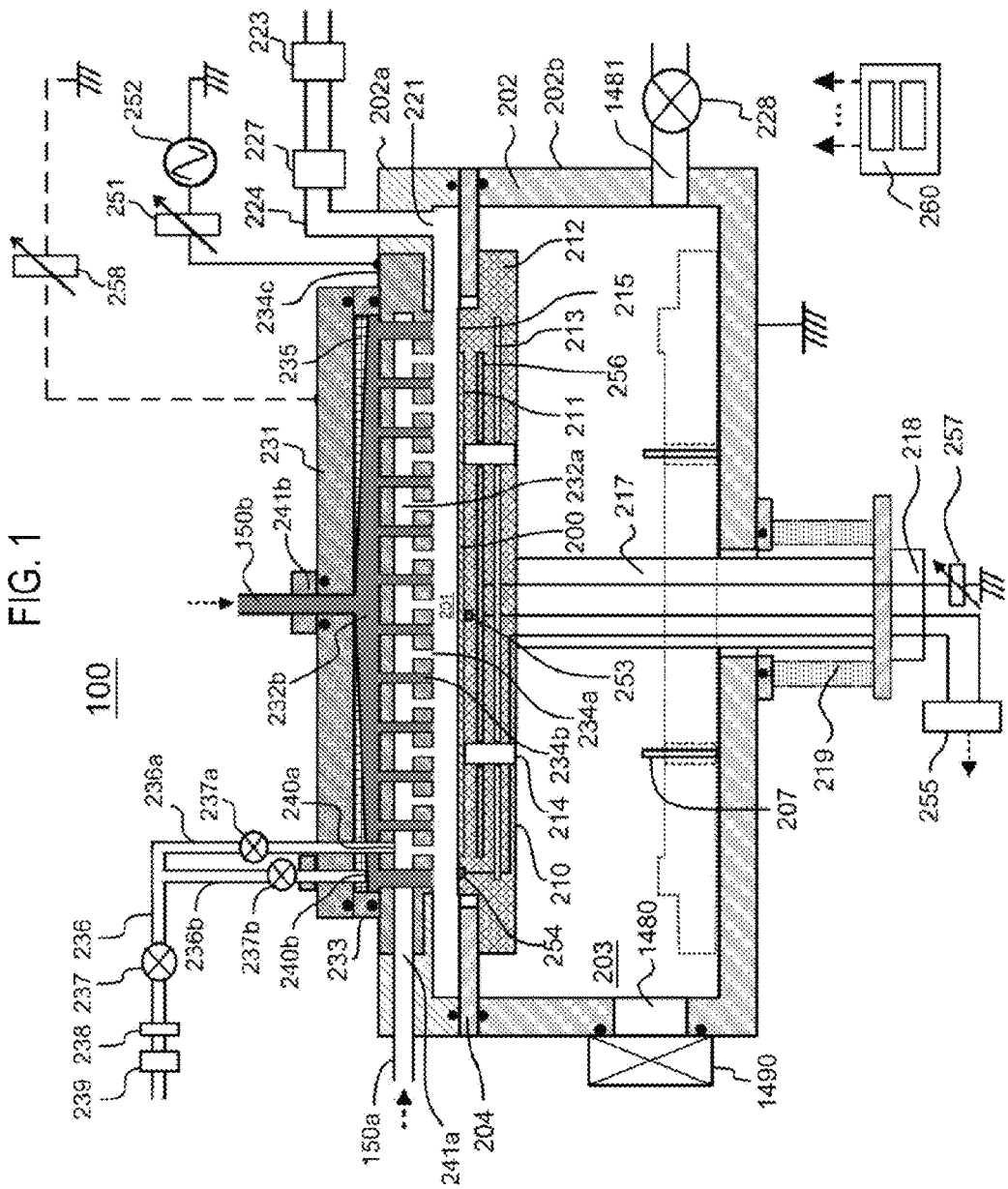
FIG. 1 is a schematic configuration view of a substrate processing apparatus according to one embodiment of the present disclosure.

A substrate processing apparatus 100 according to the present embodiment will be described. The substrate processing apparatus 100 is, for example, an insulation film forming unit. As illustrated in FIG. 1, the substrate processing apparatus 100 is configured as a single-substrate-type substrate processing apparatus.

As illustrated in FIG. 1, the substrate processing apparatus 100 includes a process container 202. The process container 202 is configured as, for example, a flat air-tight container having a circular horizontal cross section. Furthermore, the process container 202 is made of, for example, a metallic material such as aluminum (Al), stainless steel (SUS) or the like, or quartz. A process space (process chamber) 201 configured to process a wafer 200 as a substrate such as silicon wafer or the like and a transfer space (transfer chamber) 203 are formed within the process container 202. The process container 202 includes an upper container 202a and a lower container 202b. A partition plate 204 is installed between the upper container 202a and the lower container 202b. A space surrounded by the upper container 202a and disposed above the partition plate 204 will be referred to as a process chamber 201. A space surrounded by the lower container 202b and disposed under the partition plate 204 will be referred to as a transfer chamber 203.

A substrate loading/unloading gate 1480 adjoining a gate valve 1490 is provided on the side surface of the lower container 202b. A wafer 200 is moved between the transfer chamber 203 and a transport chamber (not shown) through the substrate loading/unloading gate 1480. A plurality of lift pins 207 is installed in a bottom portion of the lower container 202b. In addition, the lower container 202b is grounded.

A substrate support part 210 configured to support the wafer 200 is installed within the process chamber 201. The substrate support part 210 mainly includes a mounting surface 211 configured to mount the wafer 200 thereon, a substrate mounting table 212 having the mounting surface 211 formed on the front surface thereof, a heater 213 as a heating part installed within the substrate mounting table 212, a bias electrode 256, and a sensor (charge-up sensor) 253 configured to detect a charge-up amount (charging amount) of the wafer 200. In the substrate mounting table 212, through-holes 214, through which the lift pins 207 pass, are respectively formed in the positions corresponding to the lift pins 207. In the case where the charge-up sensor 253 is installed within the substrate mounting table 212, there is no possibility that the charge-up sensor 253 makes contact with a process gas or an activated gas. It is therefore possible to suppress generation of particles. Furthermore, if the charge-up sensor 253 is installed so as to make contact with the rear surface of the wafer 200, it is possible to accurately measure a charging amount (charging condition) of the wafer 200. As illustrated in FIG. 1, the charge-up sensor 253 may be installed between the bias electrode 256 and the wafer 200. Just like the charge-up sensor 254 illustrated in FIG. 1, the charge-up sensor may be installed at the lateral side of the wafer 200. By installing the charge-up sensor at the lateral side of the wafer 200, it is possible to reduce the influence received from the heater 213 existing within the substrate mounting table 212. This makes it possible to suppress generation of particles while accurately measuring the charging condition of the wafer 200. These arrangements of the charge-up sensors may be combined with each other. The charge-up sensors 253 and 254 may be, for example, electrically-detecting sensors such as crystal oscillators, piezoelectric elements or combinations thereof, or optically-detecting sensors.

The charge-up sensors 253 and 254 are connected to a charge-up monitor 255. The charge-up monitor 255 measures at least one of the frequency and voltage of each of the charge-up sensors 253 and 254 and analog/digital converts measured values, thereby generating charge-up information (also referred to as a charge-up amount, a charging amount, a charging state or a charging condition). The information thus generated is outputted to a controller 260, a high-frequency power source 252, a bias adjustment part 257 and so forth. The bias adjustment part 257 is configured by, for example, a variable resistor, a variable coil, a variable capacitor or the like. The adjustment of a bias is performed by adjusting individual elements.

The bias adjustment part 257 is connected to the bias electrode 256 and is configured to adjust an electric potential of the bias electrode 256. The bias adjustment part 257 is configured so as to adjust the electric potential of the bias electrode 256 based on the information outputted from one or both of the controller 260 and the charge-up monitor 255. A charging measurement part is configured by the charge-up monitor 255 and one or both of the charge-up sensor 253 and the charge-up sensor 254.

The substrate mounting table 212 is supported by a shaft 217. The shaft 217 extends through the bottom portion of the process container 202. Furthermore, the shaft 217 is connected to an elevator mechanism 218 outside the process container 202. By operating the elevator mechanism 218 to move the shaft 217 and the substrate mounting table 212 up and down, it is possible to move up and down the wafer 200 mounted on the mounting surface 211. The periphery of the lower end portion of the shaft 217 is covered with a bellows 219. The interior of the process chamber 201 is kept air-tight.

When transporting the wafer 200, the substrate mounting table 212 is moved down to a wafer transfer position indicated by a dotted line in FIG. 1. When processing the wafer 200, the substrate mounting table 212 is moved up to a processing position (wafer processing position) indicated by a solid line in FIG. 1.

Specifically, when the substrate mounting table 212 is moved down to the wafer transfer position, the upper end portions of the lift pins 207 protrude from the upper surface of the mounting surface 211 so that the lift pins 207 support the wafer 200 from below. When the substrate mounting table 212 is moved up to the wafer processing position, the lift pins 207 retract from the upper surface of the mounting surface 211 so that the mounting surface 211 supports the wafer 200 from below. The lift pins 207, which make direct contact with the wafer 200, may be made of a material such as, e.g., quartz or alumina.

(Exhaust System)

An exhaust port 221 as a first exhaust part configured to exhaust an atmosphere of the process chamber 201 is formed on a side surface of an inner wall of the process chamber 201 (the upper container 202a). An exhaust pipe 224 is connected to the exhaust port 221. A pressure regulator 227 such as an auto pressure controller (APC) or the like, which controls the internal pressure of the process chamber 201 to a predetermined pressure, and a vacuum pump 223 are sequentially and serially connected to the exhaust pipe 224. A first exhaust system (exhaust line) is mainly configured by the exhaust port 221, the exhaust pipe 224 and the pressure regulator 227. The vacuum pump 223 may be included in the configuration of the first exhaust system. Furthermore, an exhaust pipe 1481 configured to exhaust an atmosphere of the transfer chamber 203 is installed on a side surface of an inner wall of the transfer chamber 203. A pressure regulator 228 is installed in the exhaust pipe 1481 and is configured to regulate the internal pressure of the transfer chamber 203 to a predetermined pressure. The internal atmosphere of the process chamber 201 may be exhausted via the transfer chamber 203.

(Gas Introduction Port)

A first gas introduction port 241a for supplying various kinds of gases into the process chamber 201 is formed in the sidewall of the upper container 202a. Furthermore, a second gas introduction port 241b for supplying various kinds of gases into the process chamber 201 is formed in an upper surface (ceiling wall) of a shower head 234 installed in an upper portion of the process chamber 201. Configurations of individual gas supply units connected to the first gas introduction port 241a as a first gas supply part and the second gas introduction port 241b as a second gas supply part will be described later.

(Gas Dispersion Unit)

The shower head 234 as a gas dispersion unit is configured by a first buffer chamber 232a, first dispersion holes 234a, a second buffer chamber 232b and second dispersion holes 234b. The shower head 234 is installed between the second gas introduction port 241b and the process chamber 201. A first gas introduced from the first gas introduction port 241a is supplied to the first buffer chamber 232a (first dispersion part) of the shower head 234 and is supplied to the process chamber 201 via the first dispersion holes 234a. A second gas introduced from the second gas introduction port 241b is supplied to the second buffer chamber 232b (second dispersion part) of the shower head 234 via the second gas introduction port 241b formed in a lid 231 and is supplied to the process chamber 201 via the second dispersion holes 234b.

Furthermore, an electrode member 234c, which constitutes the first buffer chamber 232a, is made of an electrically conductive metal and is configured as an activation part (excitation part) for exciting a gas existing within the process chamber 201. The lid 231, which constitutes the second buffer chamber 232b, may also be made of an electrically conductive metal. When the lid 231 is configured by an electrically conductive member, an insulation block 233 is installed between the lid 231 and the electrode member 234c so as to provide insulation between the lid 231 and the electrode member 234c. A matcher 251 and a high-frequency power source 252 are connected to the electrode member 234c as an activation part and are configured to supply electromagnetic waves (high-frequency power or microwaves). This makes it possible to activate the gas existing within the process chamber 201.

Furthermore, a gas guide 235, which forms a flow of the second gas as supplied, may be installed in the second buffer chamber 232b. The gas guide 235 is formed in a conical shape so that the diameter thereof grows larger in a radial direction of the wafer 200 about the second gas introduction port 241b. The lower end portion of the gas guide 235 is formed to extend more outward than the end portion of a region in which the first dispersion holes 234a and the second dispersion holes 234b are disposed.

A shower head exhaust port 240a as a second exhaust part, which exhausts an atmosphere of the first buffer chamber 232a, is formed on the upper surface of the inner wall of the first buffer chamber 232a. A second exhaust pipe 236a is connected to the shower head exhaust port 240a. A valve 237a is installed in the second exhaust pipe 236a. An exhaust pipe 236, a valve 237, a pressure regulator 238 and a vacuum pump 239 are sequentially and serially connected to the second exhaust pipe 236a. A second exhaust part (exhaust line) is mainly configured by the shower head exhaust port 240a, the valve 237a and the second exhaust pipe 236a.

A shower head exhaust port 240b as a third exhaust part, which exhausts an atmosphere of the second buffer chamber 232b, is formed on the upper surface of the inner wall of the second buffer chamber 232b. A third exhaust pipe 236b is connected to the shower head exhaust port 240b. A valve 237b is installed in the third exhaust pipe 236b. The exhaust pipe 236, the valve 237, the pressure regulator 238 and the vacuum pump 239 are sequentially and serially connected to the third exhaust pipe 236b. A third exhaust part (exhaust line) is mainly configured by the shower head exhaust port 240b, the valve 237b and the third exhaust pipe 236b. In the present embodiment, a case is illustrated where the exhaust pipe 236, the valve 237, the pressure regulator 238 and the vacuum pump 239 are shared by the second exhaust part. Instead of installing the vacuum pump 239, the exhaust pipe 236 may be connected to the rear end of the exhaust pipe 224.

(Supply System)

A first gas supply pipe 150a is connected to the first gas introduction port 241a. A second gas supply pipe 150b is connected to the second gas introduction port 241b as a second gas supply part. A first gas and a purge gas, which will be described later, are supplied from the first gas supply pipe 150a. A second gas, a purge gas and an adjustment gas, which will be described later, are supplied from the second gas supply pipe 150b.

Figure 2:
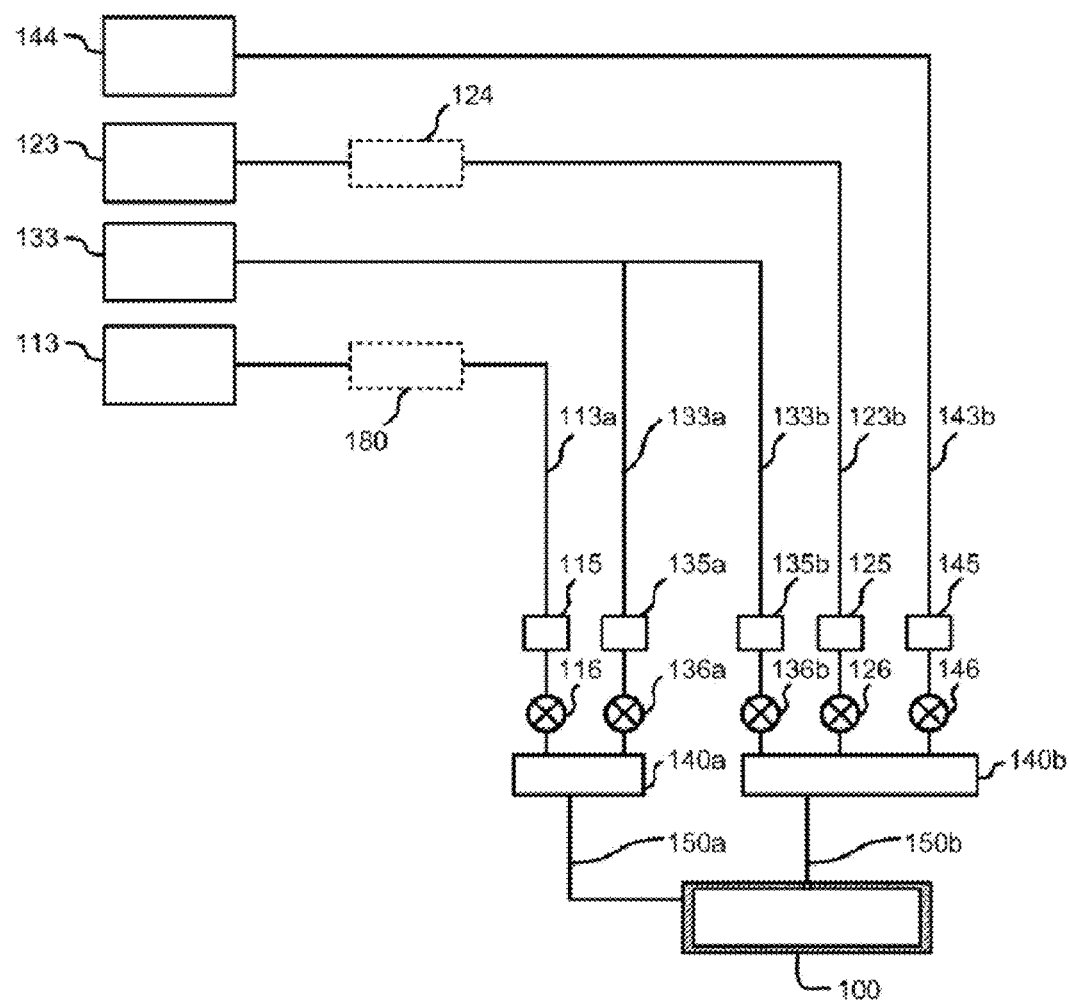
FIG. 2 is a schematic configuration view of a gas supply system according to one embodiment of the present disclosure.

In FIG. 2, there is illustrated a schematic configuration view of a first gas supply part, a second gas supply part, a purge gas supply part and a third gas supply part (adjustment gas supply part).

As illustrated in FIG. 2, a first gas supply pipe collection part 140a is connected to the first gas supply pipe 150a. A second gas supply pipe collection part 140b is connected to the second gas supply pipe 150b. A first process gas supply pipe 113a and a purge gas supply pipe 133a are connected to the first gas supply pipe collection part 140a. A second process gas supply pipe 123b, a purge gas supply pipe 133b and an adjustment gas supply pipe 143b are connected to the second gas supply pipe collection part 140b.

(First Gas Supply Part)

A first process gas supply pipe 113a, a mass flow controller (MFC) 115 and a valve 116 are installed in the first gas supply part. A first gas source 113 may be included in the first gas supply part. A vaporizer 180 may be installed in the case where a raw material of a process gas is liquid or solid.

(Second Gas Supply Part)

A second process gas supply pipe 123b, an MFC 125 and a valve 126 are installed in the second gas supply part. A second gas source 123 may be included in the second gas supply part. A remote plasma unit (RPU) 124 may be installed so as to activate the second gas.

(Purge Gas Supply Part)

Gas supply pipes 133a and 133b, MFCs 135a and 135b, and valves 136a and 136b are installed in the purge gas supply part. A purge gas source 133 may be included in the purge gas supply part.

(Third Gas Supply Part)

A gas supply pipe 143b, a MFC 145 and a valve 146 are installed in the third gas supply part (adjustment gas supply part). An adjustment gas source 144 may be included in the adjustment gas supply part. In the case where the same gas is used as the adjustment gas and the purge gas, the purge gas supply part may be regarded as the adjustment gas supply part.

(Control Part)

As illustrated in FIG. 1, the substrate processing apparatus 100 includes a controller 260 configured to control operations of the respective parts of the substrate processing apparatus 100.

Figure 3:
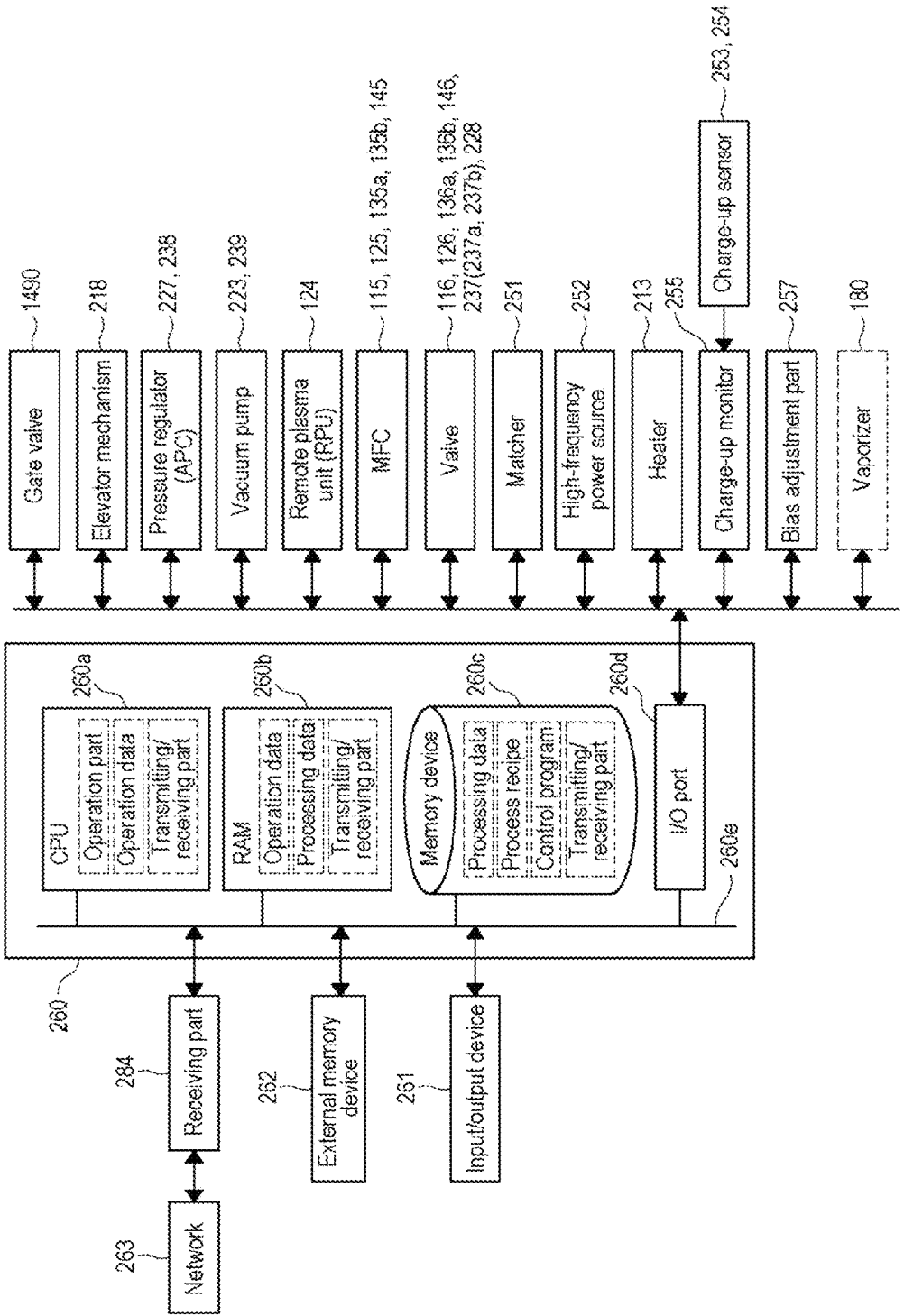
FIG. 3 is a schematic configuration view of a controller of the substrate processing apparatus according to one embodiment of the present disclosure.

The outline of the controller 260 is illustrated in FIG. 3. The controller 260, which is a control part (control means), may be configured as a computer including a central processing unit (CPU) 260a, a random access memory (RAM) 260b, a memory device 260c and an I/O port 260d. The RAM 260b, the memory device 260c and the I/O port 260d are configured to exchange data with the CPU 260a via an internal bus 260e. An input/output device 261 formed of, for example, a touch panel or the like, an external memory device 262, a receiving part 285 and the like are connected to the controller 260.

The memory device 260c is configured by, for example, a flash memory, a hard disk drive (HDD), or the like. A control program for controlling operations of the substrate processing apparatus, a process recipe, in which sequences and conditions of substrate processing to be described later are written, and operation data or processing data generated in the course of setting the process recipe used in processing the wafer 200, are readably stored in the memory device 260c. The process recipe functions as a program for causing the controller 260 to execute each sequence in the substrate processing process, which will be described later, to obtain a predetermined result. Hereinafter, the process recipe and the control program will be generally and simply referred to as a "program". Furthermore, the process recipe will also be simply referred to as a "recipe". When the term "program" is used herein, it may indicate a case of including only the recipe, a case of including only the control program, or a case of including both the recipe and the control program. The RAM 260b is configured as a memory area (work area) in which a program or data such as operation data or processing data read by the CPU 260a is temporarily stored.

The I/O port 260d is connected to the gate valve 1490, the elevator mechanism 218, the heater 213, the pressure regulators 227 and 238, the vacuum pumps 223 and 239, the matcher 251, the high-frequency power source 252, the MFCs 115, 125, 135a, 135b and 145, the valves 116, 126, 136a, 136b, 146, 237, 237a, 237b and 228, the RPU 124, the vaporizer 180, the charge-up monitor 255, the bias adjustment part 257 and so forth.

The CPU 260a is configured to read the control program from the memory device 260c and execute the same. The CPU 260a also reads the process recipe from the memory device 260c according to an input of an operation command from the input/output device 260. Furthermore, the CPU 260a is configured to calculate operation data by comparing and operating the set value inputted from the receiving part 285 and the process recipe or the control data stored in the memory device 260c. Moreover, the CPU 260a is configured to execute a process of determining corresponding process data (process recipe) from the operation data. In addition, the CPU 260a is configured to control, according to the contents of the process recipe thus read, the opening/closing operation of the gate valve 1490, the elevating operation of the elevator mechanism 218, the operation of supplying electric power to the heater 213, the pressure regulation operations of the pressure regulators 227 and 238, the on/off operations of the vacuum pumps 223 and 239, the gas flow rate control operations of the MFCs 115, 125, 135a, 135b and 145, the gas activation operation of the remote plasma unit 124, the gas on/off operations of the valves 116, 126, 136a, 136b, 146, 237, 237a, 237b and 228, the power matching operation of the matcher 251, the power control operation of the high-frequency power source 252, the arithmetic operation based on the information (data) received from the charge-up monitor 255, and so forth.

Furthermore, the controller 260 is not limited to being configured by a dedicated computer but may be configured by a general-purpose computer. For example, the controller 260 according to the present embodiment may be configured by preparing an external memory device 262 (e.g., a magnetic tape, a magnetic disc such as a flexible disc or a hard disc, an optical disc such as a CD, a DVD or the like, a magneto-optical disc such as an MO or the like, a semiconductor memory such as a USB memory, a memory card or the like) that stores the above-described program and installing the program in a general-purpose computer through the use of the external memory device 262. Furthermore, the means for supplying the program to the computer is not limited to a case where the program is supplied via the external memory device 262. For example, the program may be supplied through the use of a communication means such as a receiving part 285, a network 263 (the Internet or a dedicated line) or the like without going through the external memory device 262. Furthermore, the memory device 260c or the external memory device 262 is configured by a non-transitory computer-readable recording medium. Hereinafter, the memory device 260c and the external memory device 262 will be generally and simply referred to as a "recording medium." When the term "recording medium" is used herein, it may indicate a case of including only the memory device 260c, a case of including only the external memory device 262, or a case of including both the memory device 260c and the external memory device 262.

(2) Substrate Processing Process

Next, as one of the processes for manufacturing a semiconductor device through the use of a processing furnace of the substrate processing apparatus described above, an example of a flow and sequence of forming an insulation film, for example, a silicon nitride (SiN) film as a nitride film on a substrate will be described with reference to FIGS. 4 and 5. In the following descriptions, the operations of the respective parts that constitute the substrate processing apparatus are controlled by the controller 260.

When the term "wafer" is used herein, it may refer to "a wafer itself" or "a laminated body (aggregate) of a wafer and a predetermined layer or film formed on the surface of the wafer". That is to say, a wafer including a predetermined layer or film formed on its surface may be referred to as a wafer. In addition, when the phrase "a surface of a wafer" is used herein, it may refer to "a surface (exposed surface) of a wafer itself" or "a surface of a predetermined layer or film formed on a wafer, namely an uppermost surface of the wafer as a laminated body".

Accordingly, in the present disclosure, the expression "a predetermined gas is supplied to a wafer" may mean that "a predetermined gas is directly supplied to a surface (exposed surface) of a wafer itself" or that "a predetermined gas is supplied to a layer or film formed on a wafer, namely to an uppermost surface of a wafer as a laminated body." Furthermore, in the present disclosure, the expression "a predetermined layer (or film) is formed on a wafer" may mean that "a predetermined layer (or film) is directly formed on a surface (exposed surface) of a wafer itself" or that "a predetermined layer (or film) is formed on a layer or film formed on a wafer, namely on an uppermost surface of a wafer as a laminated body."

In addition, the term "substrate" used herein may be synonymous with the term "wafer." In this case, the term "wafer" and "substrate" may be used interchangeably in the foregoing descriptions.

Hereinafter, descriptions will be made on the substrate processing process.

(Substrate Loading Step S201)

In a film forming process, the wafer 200 is first loaded into the process chamber 201. Specifically, the substrate support part 210 is moved down by the elevator mechanism 218 so that the lift pins 207 protrude from the through-holes 214 toward the upper surface side of the substrate support part 210. After the internal pressure of the process chamber 201 and the transfer chamber 203 is regulated to a predetermined pressure, the gate valve 1490 is opened and the wafer 200 is placed from the gate valve 1490 onto the lift pins 207. After the wafer 200 is placed on the lift pins 207, the gate valve 1490 is closed and the substrate support part 210 is moved up to a specified position by the elevator mechanism 218, whereby the wafer 200 is mounted from the lift pins 207 onto the substrate support part 210.

(Pressure Reducing/Temperature Increasing Step S202)

Subsequently, the interior of the process chamber 201 is exhausted through the exhaust pipe 224 so that the internal pressure of the process chamber 201 becomes a predetermined pressure (vacuum level). At this time, the opening degree of the APC valve as the pressure regulator 227 is feedback controlled based on the pressure value measured by the pressure sensor. Furthermore, based on the temperature value detected by a temperature sensor (not shown), the amount of electric power supplied to the heater 213 is feedback controlled so that the internal temperature of the process chamber 201 becomes a predetermined temperature. Specifically, the substrate support part 210 is preheated by the heater 213 and is left alone for a predetermined time period after a change in the temperature of the wafer 200 or the substrate support part 210 is eliminated. During this time period, moisture remaining within the process chamber 201 or a gas generated from a member, if any, may be removed by vacuum exhaust or purge through the supply of a $N_2$ gas. In this way, preparation prior to a film forming process is completed. When evacuating the interior of the process chamber 201 at a predetermined pressure, the interior of the process chamber 201 may be evacuated to a reachable vacuum level at once.

At this time, the temperature of the heater 213 is set at a predetermined temperature which may fall within a range of 100 to 600 degrees C. in some embodiments, 100 to 500 degrees C. in some embodiments, and 250 to 450 degrees C. in some embodiments.

Furthermore, the electric potential of the wafer 200 is adjusted by the bias adjustment part 257 and the bias electrode 256 so as to become a predetermined electric potential.

(Film Forming Step S301)

Subsequently, descriptions will be made on an example in which a SiN film is formed on the wafer 200. Details of the film forming step S301 will be described with reference to FIGS. 4 and 5.

Figure 4:
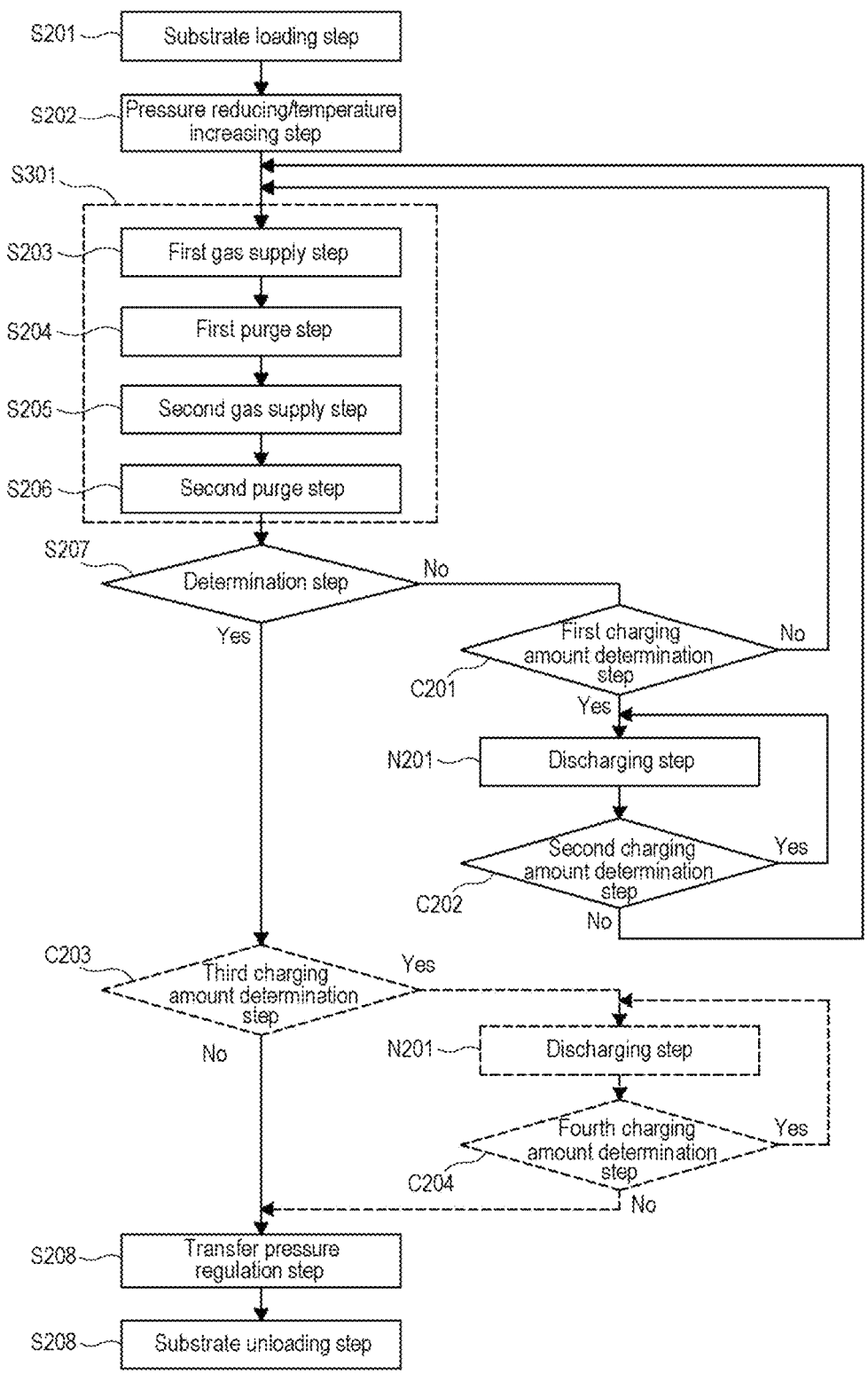
FIG. 4 is a flowchart illustrating a substrate processing process according to one embodiment of the present disclosure.
Figure 5:
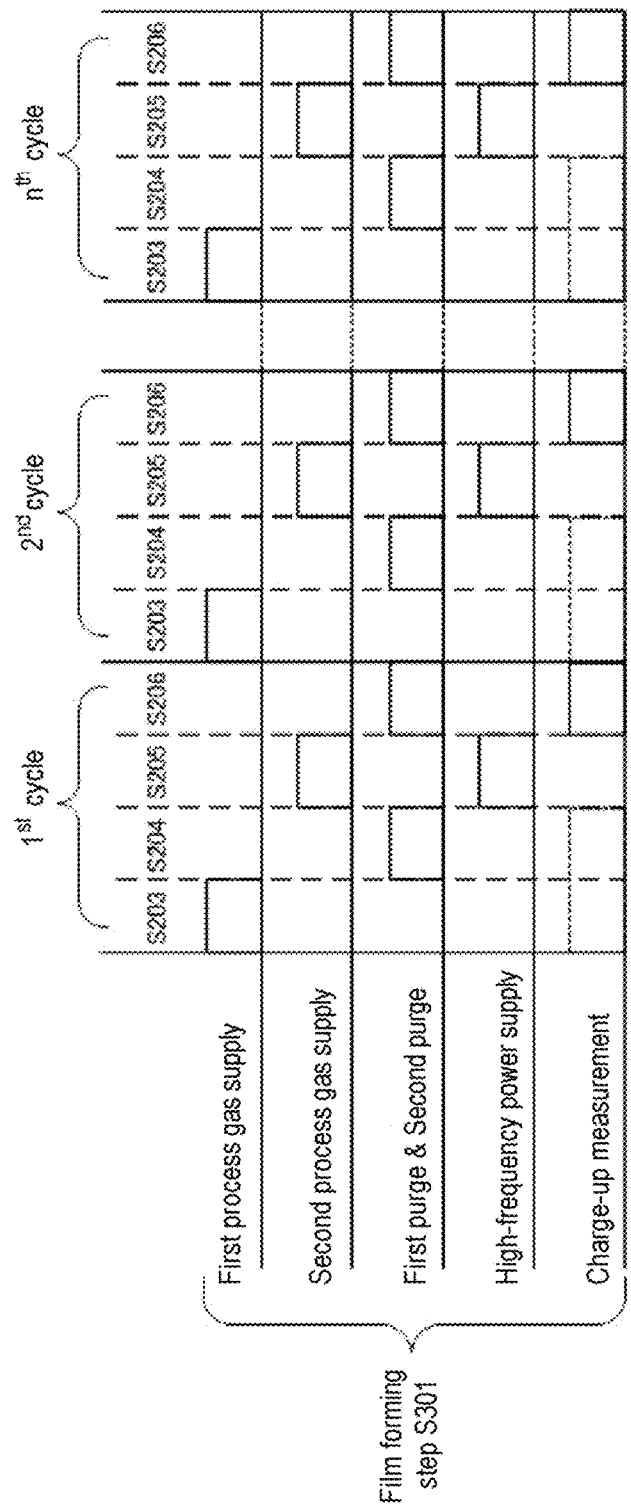
FIG. 5 illustrates a sequence example of a substrate processing process according to one embodiment of the present disclosure.

After the wafer 200 is mounted on the substrate support part 210 and after the internal atmosphere of the process chamber 201 is stabilized, steps S203 to S207 illustrated in FIGS. 4 and 5 are performed.

(First Gas Supply Step S203)

At a first gas supply step S203, a dichlorosilane ($SiH_2Cl_2$, abbreviation: DCS) gas as a first gas (process gas) is supplied from the first gas supply system into the process chamber 201. Specifically, the DCS gas supplied from the process gas supply source 113 is flow-rate-controlled by the MFC 115 and is then supplied to the substrate processing apparatus 100. The flow-rate-controlled DCS gas passes through the first buffer chamber 232a and is supplied from the gas supply holes 234a of the shower head 234 into the process chamber 201 kept in a depressurized state. Furthermore, the interior of the process chamber 201 is continuously evacuated by the exhaust system, whereby the internal pressure of the process chamber 201 is controlled to become a predetermined pressure range (a first pressure). At this time, the DCS gas is supplied to the wafer 200. The DCS gas is supplied into the process chamber 201 at a predetermined pressure (a first pressure of, for example, 10 Pa or more and 1,000 Pa or less). In this way, the DCS gas is supplied to the wafer 200. As the DCS gas is supplied, a silicon-containing layer is formed on the wafer 200. The silicon-containing layer referred to herein is a layer which contains silicon (Si) or a layer which contains silicon and chlorine (Cl).

When supplying the first gas, the charging amount of the wafer 200 may be measured by the charge-up sensors 253 and 254.

(Purge Step S204)

After the silicon-containing layer is formed on the wafer 200, the gas valve 116 of the first gas supply pipe 150a is closed to stop the supply of the DCS gas. After stopping the supply of the first gas, a purge step S204 is performed at which the first gas existing in the process chamber 201 or the process gas existing in the first buffer chamber 232a is exhausted by the first exhaust part.

At the purge step, in addition to discharging the gas by merely exhausting (vacuum-drawing) the gas, the discharge process may be performed by supplying an inert gas and extruding a residual gas. The vacuum-drawing and the supply of the inert gas may be used in combination. The vacuum-drawing and the supply of the inert gas may be performed alternately.

At this time, the valve 237a of the exhaust pipe 236 may be opened and the gas existing within the first buffer chamber 232a may be exhausted from the vacuum pump 239 through the exhaust pipe 236.

After a predetermined time period elapses, the valve 136a is closed to stop the supply of the inert gas and the valve 237a is closed to cut off a path between the first buffer chamber 232a and the vacuum pump 239. Further, the inert gas may be continuously supplied while opening the valve 136a. By continuously supplying the inert gas into the first buffer chamber 232a, it is possible to restrain a gas of another step from being introduced into the first buffer chamber 232a at another step.

At the purge step, it may be possible to employ a configuration in which a discharge operation is performed by supplying an inert gas into the first buffer chamber 232a and extruding a residual gas. The vacuum-drawing and the supply of the inert gas may be used in combination. The vacuum-drawing and the supply of the inert gas may be performed alternately. In the case where vacuum-drawing and the supply of the inert gas are performed alternately, it may be configured to perform an adjustment step (discharging step) N201 which will be described later.

At this time, the temperature of the heater 213 is set at the same temperature as used when supplying the first gas to the wafer 200. The supply flow rates of the $N_2$ gas as the purge gas supplied from the respective inert gas supply systems are respectively set to fall within a range of, for example, 100 to 20,000 sccm. As the purge gas, it may be possible to use, in addition to the $N_2$ gas, a rare gas such as an Ar gas, a He gas, a Ne gas, a Xe gas or the like.

During the first gas purge step, the charging amount of the wafer 200 may be detected by the charge-up sensors 253 and 254.

(Second Gas Supply Step S205)

After the first gas purge step, the valve 126 is opened to supply an ammonia gas ($NH_3$) as a second process gas (reaction gas) into the process chamber 201 through the gas introduction port 241b, the second buffer chamber 232b and the second dispersion holes 234b. Since the ammonia gas is supplied into the process chamber 201 through the second buffer chamber 232b and the second dispersion holes 234b, it is possible to uniformly supply the ammonia gas onto the substrate. Thus, it is possible to make the film thickness uniform.

At this time, the mass flow controller 125 is adjusted so that the flow rate of the $NH_3$ gas becomes a predetermined flow rate. The supply flow rate of the $NH_3$ gas may be, for example, 100 sccm or more and 10,000 sccm or less. Furthermore, by appropriately adjusting the pressure regulator 238, the internal pressure of the second buffer chamber 232b is set to fall within a predetermined pressure range.

High-frequency power is supplied from the high-frequency power source 252 to the electrode member 234c via the matcher 251. At the film forming step S301, first high-frequency power is supplied. By supplying the high-frequency power to the electrode member 234c, plasma of the second gas is generated on the wafer 200. This makes it possible to supply activated $NH_3$ to the silicon-containing layer and to modify the silicon-containing layer at a lower temperature. In FIG. 5, the supply of the high-frequency power is started simultaneously with the supply of the second gas. However, the high-frequency power may be supplied prior to starting the supply of the second gas. The high-frequency power may be continuously supplied from the first gas supply step S203 to the end of a determination step S207.

Furthermore, the amount of charged particles supplied to the wafer 200 may be adjusted by causing the bias adjustment part 257 to adjust the electric potential of the bias electrode 256 installed within the substrate mounting table 212.

If the $NH_3$ gas is supplied to the silicon-containing layer formed on the wafer 200, the silicon-containing layer is modified into a modified layer which contains a silicon element.

Depending on, for example, the internal pressure of the process chamber 201, the flow rate of the $NH_3$ gas, the temperature of the wafer 200, the electric power of the high-frequency power source 252 or the like, the modified layer is formed to have a predetermined thickness, a predetermined distribution and a predetermined penetration depth of a nitrogen component or the like with respect to the silicon-containing layer.

After a predetermined time period elapses, the valve 126 is closed and the supply of the $NH_3$ gas is stopped.

At this time, the temperature of the heater 213 is set at the same temperature as used when supplying the first gas to the wafer 200.

When supplying the second process gas, if the $NH_3$ gas activated through the use of the RPU 124 is supplied to the second buffer chamber 232b, it is possible to form a larger amount of the modified layer. When the $NH_3$ gas flows through the RPU 124, it may be possible to perform control so that the RPU 124 is kept in an on-state (power-on state) to activate (excite) the $NH_3$ gas.

As illustrated in FIG. 1, a second impedance adjustment part 258 may be installed in the lid 231 of the shower head 234 so that plasma can be generated within the second buffer chamber 232b by adjusting impedance.

(Purge Step S206)

After stopping the supply of the $NH_3$ gas, a purge step S206 is performed by causing the first exhaust part to exhaust the $NH_3$ gas existing in the process chamber 201 or the $NH_3$ gas existing in the second buffer chamber 232b.

At the purge step, in addition to discharging the gas by merely exhausting (vacuum-drawing) the gas, the discharge process may be performed by supplying an inert gas and extruding a residual gas. The vacuum-drawing and the supply of the inert gas may be used in combination. The vacuum-drawing and the supply of the inert gas may be performed alternately.

Furthermore, the valve 237b may be opened and the gas existing within the second buffer chamber 232b may be exhausted from the vacuum pump 239 through the exhaust pipe 236.

At the purge step, it may be possible to employ a configuration in which a discharge operation is performed by supplying an inert gas into the second buffer chamber 232b and extruding a residual gas. The vacuum-drawing and the supply of the inert gas may be used in combination. The vacuum-drawing and the supply of the inert gas may be performed alternately. In the case where vacuum-drawing and the supply of the inert gas are performed alternately, it may be configured to perform an adjustment step (discharging step) N201 which will be described later.

During the second gas purge step, the detection of the charging condition of the wafer 200 (the charge-up measurement) is performed by the charge-up sensors 253 and 254. Measurement data are transmitted from the charge-up monitor 255 to the controller 260.

(Determination Step S207)

After the purge step S206 is completed, the controller 260 determines whether the film forming step S301 (steps S203 to S206) has been performed a predetermined number of cycles n. That is to say, the controller 260 determines whether a film having a desired thickness is formed on the wafer 200. By performing one cycle including the aforementioned steps S203 to S206 at least once (step S301), it is possible to form a SiN film having a predetermined film thickness on the wafer 200. The aforementioned cycle may be performed multiple times. Thus, a SiN film having a predetermined film thickness is formed on the wafer 200.

If it is determined at the determination step S207 that the film forming step S301 has not been performed a predetermined number of times (if it is determined to be No), the cycle of the film forming step S301 is repeated. If it is determined at the determination step S207 that the film forming step S301 has been performed a predetermined number of times (if it is determined to be Yes), the film forming step S301 is completed. Thereafter, a substrate unloading step S209 is performed.

In this regard, the present inventors have found that the following problems (A), (B) and (C) are generated if the film forming step S301 is performed once or more or repeatedly performed a predetermined number of times.

(A)

Depending on the charging condition of the wafer 200 at the second gas supply step S205 performed in the second and subsequent cycles, the reactivity between the film formed on the wafer 200 and the second gas or the active species of the second gas is changed. For example, if the wafer 200 is positively charged, the amount of positive ions existing in the plasma of the $NH_3$ gas as the second gas and reaching the wafer 200 is reduced. If the wafer 200 is negatively charged, the amount of positive ions existing in the plasma of the $NH_3$ gas and reaching the wafer 200 is increased. Thus, the nitrogen concentration in the silicon-containing layer formed in the first cycle differs from the nitrogen concentration in the silicon-containing layer formed in the second and subsequent cycles. Furthermore, the charge-up (charging) is often unevenly generated within the plane of the wafer 200. This poses a problem in that the processing uniformity or the step coverage in the plane of the wafer 200 is reduced.

(B)

Furthermore, if the wafer 200 is excessively charged or if a specific portion of the wafer 200 is excessively charged, there is a problem in that the insulation portion of an element formed on the wafer 200 is destroyed.

(C)

In addition, if the wafer 200 is charged or if a specific portion of the wafer 200 is charged, there is a problem in that particles or byproducts existing within the process chamber 201 or the transfer chamber 203 are adsorbed onto the wafer 200, consequently reducing the processing uniformity. The byproducts referred to herein are, for example, hydrogen chloride (HCl) and ammonium chloride ($NH_4Cl$).

The present inventors have found that the aforementioned problems can be solved by performing the following adjustment step (discharging step) N201. Hereinafter, descriptions will be made on the discharging step N201.

(First Charging Amount Determination Step C201)

When it is determined to be No at the determination step S207, a first charging amount determination step C201 is performed. At the first charging amount determination step C201, based on the information measured by one or both of the charge-up sensors 253 and 254, the controller 260 performs a process of determining whether the charging condition of the wafer 200 is equal to or larger than a first set value. Specifically, the set data 801 recorded in the recording medium and the measured charging condition are compared by the operation part of the CPU 260a to determine whether the charging amount is equal to or larger than a first set value. If the charging amount of the wafer 200 is not equal to or larger than the first set value (if it is determined to be No), the film forming step S301 is merely performed again. If the charging amount of the wafer 200 is equal to or larger than the first set value (if it is determined to be Yes), the discharging step N201 is performed.

(Discharging Step N201)

Figure 6:
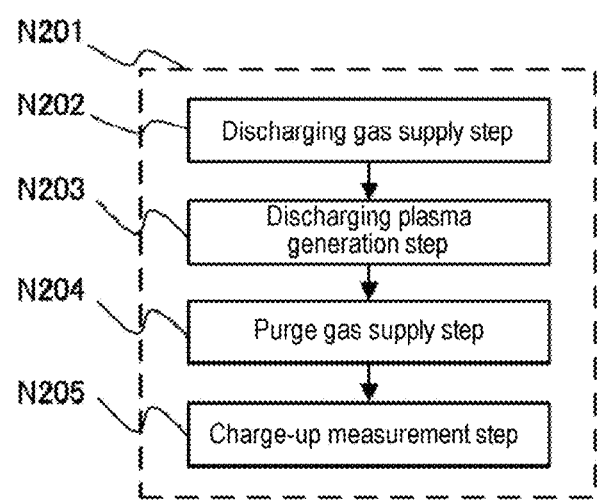
FIG. 6 is a flowchart of a discharging process according to one embodiment of the present disclosure.

At a discharging step N201, steps N202, N203, N204 and N205 illustrated in FIGS. 6 and 7 are performed.

(Discharging Gas Supply Step N202)

At a discharging gas supply step N202, an argon (Ar) gas or a helium (He) gas as an adjustment gas (discharging gas) is supplied onto the wafer 200. At this time, electric potential adjustment for controlling the electric potential of the bias electrode 256 installed within the substrate mounting table 212 is performed by the bias adjustment part 257. The electric potential of the bias electrode 256 may be set at the same electric potential as used at the film forming step S301 or may be changed depending on the charging condition of the wafer 200. For example, when the wafer 200 is negatively charged, the electric potential of the bias electrode 256 is reduced so as to increase the introduction amount of a positive ion component existing in the plasma. When the wafer 200 is positively charged, the electric potential of the bias electrode 256 is increased so as to increase the introduction amount of a negative ion component or an electron component existing in the plasma.

In the present embodiment, an example is illustrated in which the discharging gas supply step N202 is started prior to starting a discharging plasma generation step N203. However, the present disclosure is not limited thereto. It may be possible to employ a configuration in which the discharging gas supply step N202 is performed simultaneously with the start of supply of the high-frequency power or during a period between the start of supply of the high-frequency power and the end of supply of the high-frequency power.

(Discharging Plasma Generation Step N203)

At a discharging plasma generation step N203, second high-frequency power is supplied from the high-frequency power source 252 to the electrode member 243*c* via the matcher 251. As illustrated in FIG. 7, the second high-frequency power is set smaller than the electric power used at the film forming step S301. By setting the electric power in this way, it is possible to reduce the influence on the characteristics of the film formed on the wafer 200. By generating plasma with this electric power, it is possible to supply both an ion component and an electron component existing in the plasma to the wafer 200 and to adjust the charging condition of the wafer 200. For example, if one of the ion component and the electron component existing in the plasma is continuously supplied, there is a possibility that the wafer 200 is charged with the polarity opposite to the originally-charged polarity. However, by supplying both the ion component and the electron component existing in the plasma, it is possible to restrain the wafer 200 from being charged with the opposite polarity.

In this regard, it may be possible to employ a configuration in which the frequency of the high-frequency power is changed depending on the charging state of the wafer 200. For example, when the wafer 200 is positively charged, the frequency of the second high-frequency power supplied to the electrode member 234*c* may be set lower than the frequency of the first high-frequency power. This makes it possible to increase the introduction amount of the electron component existing in the plasma. In addition, by setting the frequency of the second high-frequency power higher than the frequency of the first high-frequency power, it is possible to make the amount of the electron component supplied to the wafer 200 larger than the amount of the ion component supplied to the wafer 200.

In the present embodiment, there has been described an example in which the discharging plasma generation step N203 is performed at the discharging step N201. However, it may be possible to employ a configuration in which the discharging plasma generation step N203 is performed during the aforementioned film forming step S301. For example, even if unexpected charging occurs at the first gas supply step S203 and the purge steps S204 and S206 of the film forming step S301, by adjusting the charging condition of the wafer 200, it is possible to keep the wafer 200 at a predetermined charging amount and to supply active species of the second gas at a predetermined amount.

(Purge Gas Supply Step N204)

After supplying the discharging plasma, a purge gas is supplied onto the wafer 200 to remove a discharging gas from above the wafer 200. The purge gas used at this time may be the same as the purge gas used at the aforementioned purge steps S204 and S206.

(Charge-up Measurement Step N205)

After supplying the purge gas, the charging amount of the wafer 200 is measured by the charge-up sensors 253 and 254 and the charge-up monitor 255. As described above, the measured information is transmitted to the controller 260. The charge-up measurement may be started from the purge gas supply step N204. In the case where multiple cycles of the discharging step N201 are performed, it may be configured so that the discharging step N201 is performed by the discharging gas supply step N202.

(Second Charging Amount Determination Step C202)

After the charge-up measurement step N205, a second charging amount determination step C202 is performed. At the second charging amount determination step C202, the same determination process as in the first charging amount determination step C201 is performed. That is to say, if it is determined that the charging amount of the wafer 200 is not equal to or larger than a first set value (if it is determined to be No), the film forming step S301 is merely performed again. If it is determined that the charging amount of the wafer 200 is equal to or larger than the first set value (if it is determined to be Yes), the discharging step N201 is performed. In this way, the discharging step N201 is repeatedly performed until the charging amount of the wafer 200 becomes smaller than the first set value.

By performing the discharging step N201 in this way so that the charging amount of the wafer 200 becomes smaller than the first set value, the amount of active species supplied to the wafer 200 at the second gas supply step S205 can be made uniform in every cycle. This makes it possible to improve the processing uniformity of the wafer 200. Since the amount of active species can be made uniform in every cycle, it is possible to improve the processing quality of the film formed on the wafer 200.

(Substrate Unloading Step S209)

After the film forming step S301 is performed a predetermined number of times, the substrate mounting table 212 is moved down by the elevator mechanism 218 so that the lift pins 207 protrude from the through-holes 214 toward the upper surface side of the substrate support part 210. In addition, after the internal pressure of the process chamber 201 is regulated to a predetermined pressure, the gate valve 1490 is opened and the wafer 200 is transported from above the lift pins 207 to a position outside of the gate valve 1490.

(Third Charging Amount Determination Step C203)

Prior to the substrate unloading step S209, a third charging amount determination step C203 may be performed. For example, depending on the charging amount of the wafer 200, the wafer 200 may be stuck to the substrate mounting table 212. If the substrate mounting table 212 is moved down with the wafer 200 stuck to the substrate mounting table 212, there is a possibility that a strong stress is applied to the wafer 200 by the lift pins 207. In this case, it is advisable to perform the third charging amount determination step C203, the discharging step N201 and a fourth charging amount determination step C204.

For example, at the third charging amount determination step C203 and the fourth charging amount determination step C204, a determination process is performed based on a second set value larger than the first set value used as a determination criteria at the first charging amount determination step C201 and the second charging amount determination step C202. That is to say, the first set value is such a charging amount that prevents at least active species from reaching the wafer 200. The second set value is such a charging amount that allows the wafer 200 to be electrostatically adsorbed onto the substrate mounting table 212.

Now, the feedback control of the charge-up amount of the wafer 200 will be described with reference to FIG. 8. FIG. 8 is a schematic block diagram illustrating the configuration of a control system of the charging amount of the wafer 200. The set data 801, the operation part of the CPU 260a, the controller 260, the high-frequency power source 252, the electrode member 234c, the charge-up amount 802 and the charge-up monitor 255, which are the components illustrated in FIG. 8, constitutes a control loop. The set data 801 are recorded in the recording medium and are read as a predetermined charging amount at the pressure reducing/temperature increasing step S202 or other steps. Based on the set data 801 thus read, the controller 260 sets the bias value of the bias adjustment part 257 and adjusts the electric potential of the bias electrode 256, whereby the wafer 200 is adjusted into a predetermined charging condition. As illustrated in FIG. 8, the charging condition of the wafer 200 may be adjusted based on the information outputted from the charge-up monitor 255. At the discharging step N201 performed after the first cycle of the film forming step S301, the information mainly outputted from the charge-up monitor 255 and the set data 801 are compared by the operation part of the CPU 260a to set the output electric power of the high-frequency power source 252. It may be configured so as to operate one or both of the high-frequency power source 252 and the bias adjustment part 257.

While one embodiment of the present disclosure has been specifically described above, the present disclosure is not limited to the aforementioned embodiment but may be differently modified without departing from the spirit of the present disclosure.

In the foregoing descriptions, there has been illustrated the method of forming the film by alternately supplying a precursor gas and a reaction gas. However, the present disclosure may be applied to other methods. For example, it may be possible to use a method in which the supply timings of a precursor gas and a reaction gas overlap with each other.

In the foregoing descriptions, there has been illustrated the film forming process. However, the present disclosure may be applied to other processes, for example, a diffusion process using plasma, an oxidation process, a nitriding process, an oxynitriding process, a reduction process, an oxidation/reduction process, an etching process and a heating process. For example, the present disclosure may be applied to a case where a substrate surface or a film formed on a substrate is subjected to a plasma oxidation process or a plasma nitriding process using only a reaction gas. Furthermore, the present disclosure may be applied to a plasma annealing process using only a reaction gas.

In the foregoing descriptions, there has been illustrated the semiconductor device manufacturing process. However, the present disclosure may be applied to processes other than the semiconductor device manufacturing process, for example, substrate processing processes such as a liquid crystal device manufacturing process, a solar cell manufacturing process, a light emitting device manufacturing process, a glass substrate processing process, a ceramic substrate processing process and a conductive substrate processing process.

In the foregoing descriptions, there has been illustrated the example where the silicon nitride film is formed using the silicon-containing gas as the precursor gas and using the nitrogen-containing gas as the reaction gas. However, the present disclosure may be applied to film formation using other gases. For example, the present disclosure may be applied to formation of an oxygen-containing film, a nitrogen-containing film, a carbon-containing film, a boron-containing film, a metal-containing film or a film containing these elements. Examples of these films may include an AlO film, a ZrO film, an HfO film, a HfAlO film, a ZrAlO film, a SiC film, a SiCN film, a SiBN film, a TiN film, a TiC film and a TiAlC film.

In the foregoing descriptions, there has been illustrated the apparatus configuration in which one substrate is processed in one process chamber. However, the present disclosure is not limited thereto but may be applied to an apparatus in which a plurality of substrates is horizontally or vertically arranged.

According to the technique of the present disclosure in some embodiments, it is possible to form a uniform film within a substrate plane.

While certain embodiments have been described, these embodiments have been presented by way of example only, and are not intended to limit the scope of the disclosures. Indeed, the novel methods and apparatuses described herein may be embodied in a variety of other forms; furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A method of manufacturing a semiconductor device, comprising:
   forming a film, wherein the act of forming the film includes: transferring a substrate to a process chamber; supplying a first gas to the substrate; and supplying a second gas to the substrate by converting the second gas to plasma with a first high-frequency wave; and
   performing an adjustment after the act of forming the film, wherein the act of performing the adjustment includes: measuring a charging condition of the substrate, setting a second high-frequency wave based on the measured charging condition, supplying a third gas to the substrate by converting the third gas to plasma with the second high-frequency wave, and adjusting the charging condition of the substrate.

2. The method of claim 1, wherein the act of performing the adjustment is repeated until the charging condition of the substrate falls within a predetermined set value.

3. The method of claim 2, wherein the act of forming the film and the act of performing the adjustment are alternately performed.

4. The method of claim 3, wherein in the act of performing the adjustment, an amount of charged particles generated by the plasma and supplied to the substrate is adjusted by adjusting one or both of electric power and frequency of the second high-frequency wave based on the measured charging condition.

5. The method of claim 4, wherein electric power of the second high-frequency wave is smaller than electric power of the first high-frequency wave.

6. The method of claim 2, wherein in the act of performing the adjustment, an amount of charged particles generated by the plasma and supplied to the substrate is adjusted by adjusting one or both of electric power and frequency of the second high-frequency wave based on the measured charging condition.

7. The method of claim 2, wherein electric power of the second high-frequency wave is smaller than electric power of the first high-frequency wave.

8. The method of claim 1, wherein the act of forming the film and the act of performing the adjustment are alternately performed.

9. The method of claim 1, wherein in the act of performing the adjustment, an amount of charged particles generated by the plasma and supplied to the substrate is adjusted by adjusting one or both of electric power and frequency of the second high-frequency wave based on the measured charging condition.

10. The method of claim 1, wherein electric power of the second high-frequency wave is smaller than electric power of the first high-frequency wave.

* * * * *